(12) United States Patent
Nakamura et al.

(10) Patent No.: US 11,527,471 B2
(45) Date of Patent: Dec. 13, 2022

(54) SEMICONDUCTOR DEVICE AND METHOD OF MANUFACTURING THE SEMICONDUCTOR DEVICE

(71) Applicant: Mitsubishi Electric Corporation, Tokyo (JP)

(72) Inventors: Kota Nakamura, Fukuoka (JP); Hiromi Tominaga, Fukuoka (JP); Junichi Murakami, Fukuoka (JP); Hidenori Shigeoka, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 101 days.

(21) Appl. No.: 16/835,582

(22) Filed: Mar. 31, 2020

(65) Prior Publication Data

US 2020/0343174 A1 Oct. 29, 2020

(30) Foreign Application Priority Data

Apr. 24, 2019 (JP) .............................. JP2019-082715

(51) Int. Cl.
*H01L 23/498* (2006.01)
*H01L 21/48* (2006.01)
*H01L 23/31* (2006.01)

(52) U.S. Cl.
CPC ...... *H01L 23/49861* (2013.01); *H01L 21/485* (2013.01); *H01L 23/3121* (2013.01)

(58) Field of Classification Search
CPC ........... H01L 23/49861; H01L 23/3121; H01L 23/49555; H01L 23/49548; H01L 23/49; H01L 21/485; H01L 21/4885
See application file for complete search history.

(56) References Cited

U.S. PATENT DOCUMENTS 3,762,039 A * 10/1973 Douglass .......... H01L 23/49541
257/E23.128
4,246,627 A * 1/1981 Poensgen ............... H05K 3/308
174/541
(Continued)

FOREIGN PATENT DOCUMENTS

JP 59159550 A * 9/1984 ............. H05K 3/308
JP 62098656 A * 5/1987 ....... H01L 23/49541
(Continued)

OTHER PUBLICATIONS

An Office Action; "Notice of Reasons for Refusal", mailed by the Japanese Patent Office dated Mar. 15, 2022, which corresponds to Japanese Patent Application No. 2019-082715 and is related to U.S. Appl. No. 16/835,582; with English language translation.

*Primary Examiner* — Andres Munoz
(74) *Attorney, Agent, or Firm* — Studebaker & Brackett PC

(57) ABSTRACT

A semiconductor device is a substrate inserted lead-type semiconductor device to be mounted through insertion of a plurality of lead terminals into a plurality of respective through holes of a substrate. The semiconductor device includes: an energization controller including a semiconductor element and wiring; a sealing resin to cover the energization controller; and the lead terminals each having one end side connected to the energization controller and the other end side protruding from the sealing resin. The lead terminals each have a protrusion formed on a part of the other end side protruding from the sealing resin.

11 Claims, 10 Drawing Sheets

(56) References Cited

U.S. PATENT DOCUMENTS

| | | | | |
|---|---|---|---|---|
| 4,257,668 A * | 3/1981 | Ellis, Jr. | ............ | H01R 4/028 |
| | | | | 439/59 |
| 5,166,570 A * | 11/1992 | Takahashi | ............ | H01G 2/06 |
| | | | | 174/528 |
| 5,398,165 A * | 3/1995 | Niinou | ............ | H05K 3/308 |
| | | | | 228/180.1 |
| 5,460,319 A * | 10/1995 | Kato | ............ | H01R 4/028 |
| | | | | 174/260 |
| 7,211,838 B2 * | 5/2007 | Miyazawa | ............ | H05B 33/22 |
| | | | | 257/187 |
| 7,321,444 B2 * | 1/2008 | Hirayama | ............ | B41J 2/04541 |
| | | | | 358/1.17 |
| 8,479,390 B2 * | 7/2013 | Ohnishi | ............ | H01R 13/03 |
| | | | | 29/874 |
| 2002/0036781 A1 * | 3/2002 | Hirayama | ............ | B41J 2/04541 |
| | | | | 358/1.4 |
| 2002/0058428 A1 * | 5/2002 | Torii | ............ | H01R 12/58 |
| | | | | 439/83 |
| 2003/0160247 A1 * | 8/2003 | Miyazawa | ............ | H05B 33/22 |
| | | | | 257/79 |
| 2004/0145043 A1 | 7/2004 | Hayashi et al. | | |
| 2010/0207150 A1 * | 8/2010 | Grajcar | ............ | H05K 3/308 |
| | | | | 257/E33.068 |

FOREIGN PATENT DOCUMENTS

| | | | |
|---|---|---|---|
| JP | 03068162 A | * | 3/1991 |
| JP | H05-028053 U | | 4/1993 |
| JP | 2001-210775 A | | 8/2001 |
| JP | 2004-063688 A | | 2/2004 |
| JP | 2007-287765 A | | 11/2007 |

* cited by examiner

F I G. 6
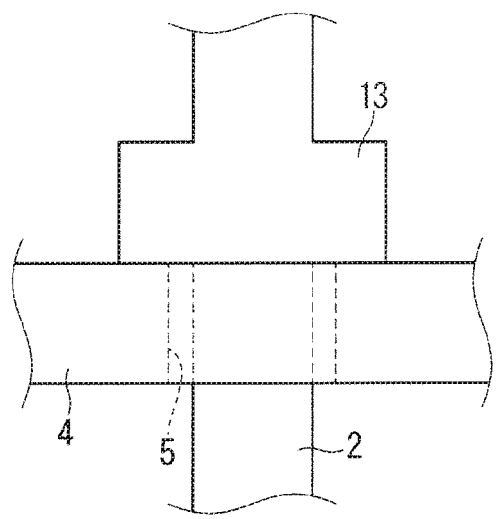
F I G. 7
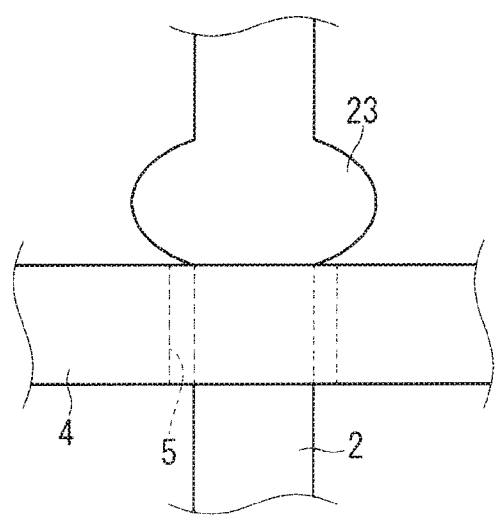

F I G. 8
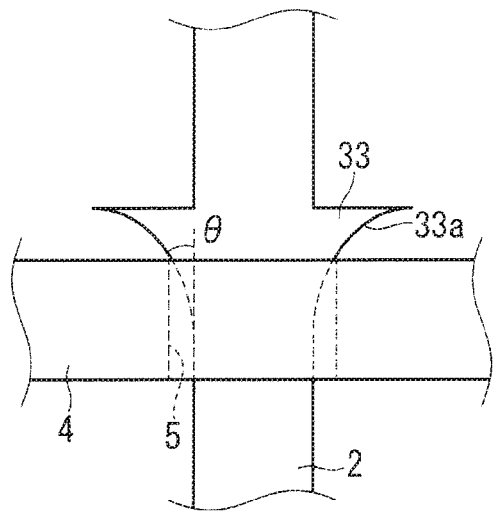
F I G. 9
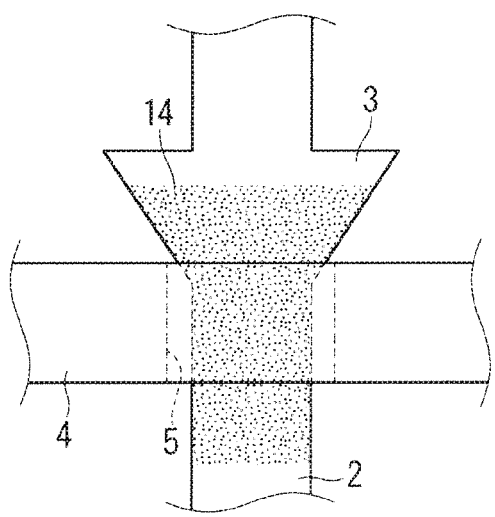

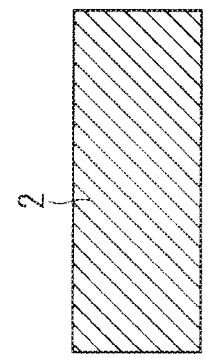
F I G. 20A
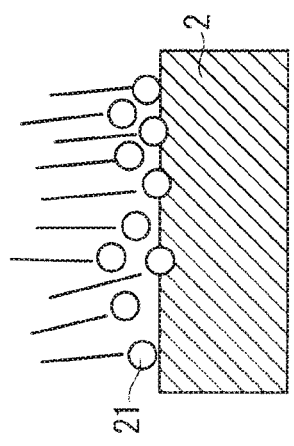
F I G. 20B
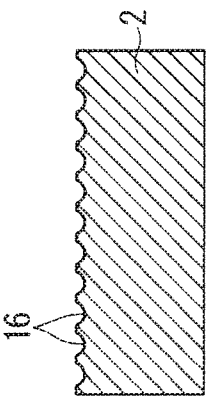
F I G. 20C

SEMICONDUCTOR DEVICE AND METHOD OF MANUFACTURING THE SEMICONDUCTOR DEVICE

BACKGROUND OF THE INVENTION

Field of the Invention

The present invention relates to a substrate inserted lead-type semiconductor device and a method of manufacturing the substrate inserted lead-type semiconductor device.

Description of the Background Art

In a conventional surface mount lead-type semiconductor device, the surfaces of lead terminals and the like are processed to improve bonding of the lead terminals to a sealing resin and to solder (see Japanese Patent Application Laid-Open No. 2007-287765, for example).

To improve joining of the lead terminals to a substrate on which a semiconductor element is mounted, it is necessary to form solder fillets at joints of the lead terminals to the substrate.

In a substrate inserted lead-type semiconductor device, however, intermediate portions of the lead terminals are joined to the substrate, and stress is put by gravity so that solder flows downward. Compared with the surface mount lead-type semiconductor device, it is difficult to form the solder fillets having normal shapes. The shapes of the solder fillets vary depending on the amount of solder, the temperature of the lead terminals and around the lead terminals, and the like, so that the solder fillets might not stably be formed.

SUMMARY

It is an object of the present invention to provide technology enabling stable formation of solder fillets at mounting on a substrate in a substrate inserted lead-type semiconductor device.

A semiconductor device according to the present invention is a substrate inserted lead-type semiconductor device to be mounted through insertion of a plurality of lead terminals into a plurality of respective through holes of a substrate. The semiconductor device includes an energization controller, a sealing resin, and the lead terminals. The energization controller includes a semiconductor element and wiring. The sealing resin covers the energization controller. The lead terminals each have one end side connected to the energization controller and the other end side protruding from the sealing resin. The lead terminals each have a protrusion formed on a part of the other end side protruding from the sealing resin.

Since the lead terminals each have the protrusion formed on the part of the other end side protruding from the sealing resin, the solder fillets can stably be formed at mounting on the substrate in the substrate inserted lead-type semiconductor device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 6 is an enlarged view of a protrusion and its surroundings of a semiconductor device according to Modification 1 of Embodiment 1 at insertion into the substrate;

FIG. 7 is an enlarged view of a protrusion and its surroundings of a semiconductor device according to Modification 2 of Embodiment 1 at insertion into the substrate;

FIG. 8 is an enlarged view of a protrusion and its surroundings of a semiconductor device according to Modification 3 of Embodiment 1 at insertion into the substrate;

FIG. 9 is an enlarged view of a protrusion and its surroundings of a semiconductor device according to Embodiment 2 at insertion into the substrate;

FIGS. 20A to 20C illustrate a method of forming the asperities.

DESCRIPTION OF THE PREFERRED EMBODIMENTS

Embodiment 1

Figure 1:
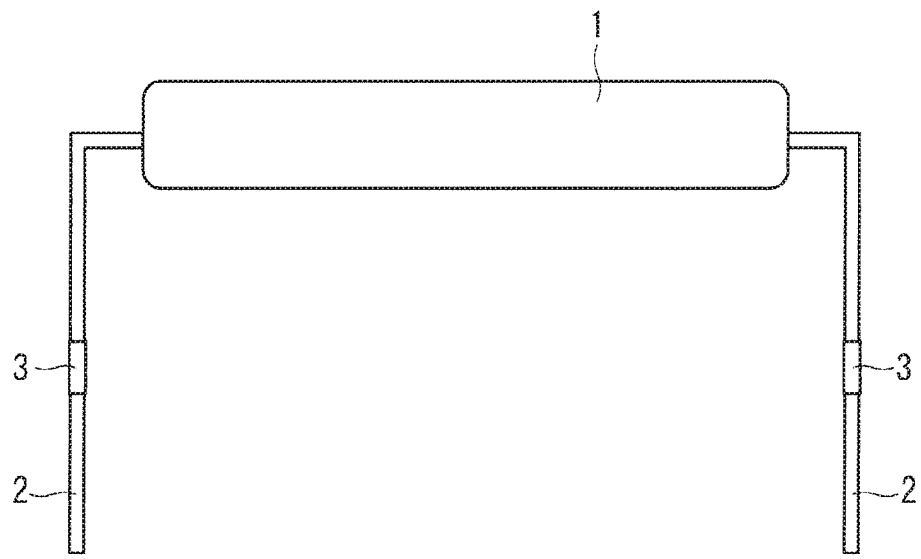
FIG. 1 is a side view of a semiconductor device according to Embodiment 1.
Figure 2:
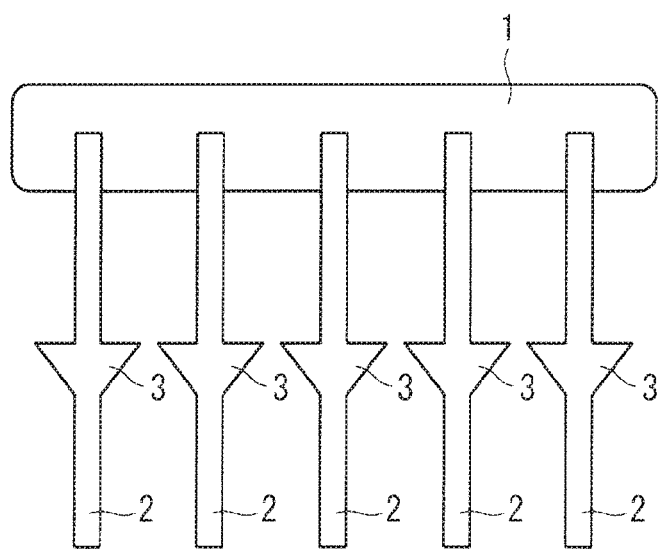
FIG. 2 is a front view of the semiconductor device.

Embodiment 1 of the present invention will be described below with reference to the drawings. FIG. 1 is a side view of a semiconductor device 100 according to Embodiment 1. FIG. 2 is a front view of the semiconductor device 100.

As illustrated in FIGS. 1 and 2, the semiconductor device 100 is a substrate inserted lead-type semiconductor device to be mounted through insertion of a plurality of lead terminals 2 into a plurality of respective through holes 5 (see FIG. 3) of a substrate 4 (see FIG. 3), and includes an energization controller (not illustrated), a sealing resin 1, and the lead terminals 2. The sealing resin 1 is rectangular in plan view, and seals the energization controller and one end side of each of the lead terminals 2. Five out of (e.g., ten) lead terminals 2 protrude from each of the front and the back of the sealing resin 1. The energization controller includes a semiconductor element and wiring, and is connected to the one end side of each of the lead terminals 2.

The other end side of each of the lead terminals 2 protrudes from the sealing resin 1, and is open to be connected to the substrate 4. The other end side of each of the lead terminals 2 extends horizontally from the front and the back of the sealing resin 1, and is bent at an intermediate portion to extend downward. Portions of the lead terminals 2 extending downward have protrusions 3 each locally having an increased width.

Figure 3:
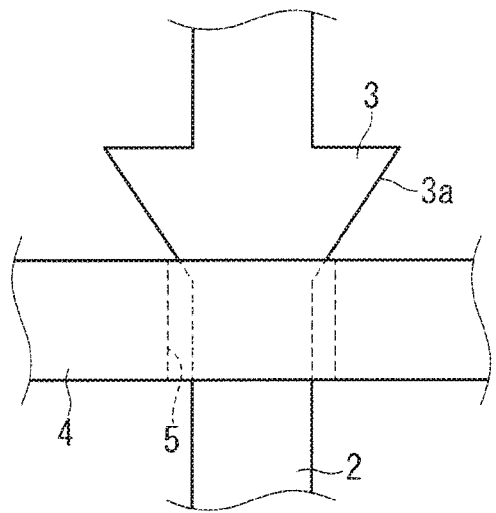
FIG. 3 is an enlarged view of a protrusion and its surroundings of the semiconductor device at insertion into a substrate.

Each of the protrusions 3 will be described in details next. FIG. 3 is an enlarged view of a protrusion 3 and its surroundings of the semiconductor device 100 at insertion into the substrate.

As illustrated in FIGS. 2 and 3, the protrusion 3 is tapered, that is to say, inverted triangular in front view to become narrower with increasing distance from the energization controller. A portion above a lower end portion of the protrusion 3 is wider than each of the through holes 5 of the substrate 4, and, in a state of the lead terminal 2 being inserted into the through hole 5 of the substrate 4, the lower end portion of the protrusion 3 is located at an upper end of the through hole 5.

Figure 4:
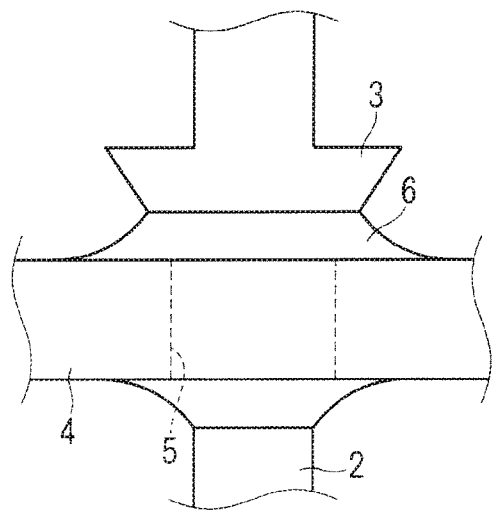
FIG. 4 is an enlarged view of the protrusion and its surroundings of the semiconductor device at mounting on the substrate.

Effects obtained in a case where the lead terminals 2 have the protrusions 3 compared with a case where the lead terminals 2 have no protrusions 3 will be described next with reference to FIGS. 3 and 4. FIG. 4 is an enlarged view of the protrusion 3 and its surroundings of the semiconductor device 100 at mounting on the substrate. At mounting on the substrate, the lead terminals 2 are fixed to the substrate 4 using solder 6.

The solder 6 is supplied from below the substrate 4 using a soldering iron or in the form of a jet, so that a solder fillet is stably formed on a bottom surface of the substrate 4. In the case where the lead terminals 2 have no protrusions 3, however, stress is put so that the solder 6 flows downward, and thus the solder fillet might not stably be formed on a top surface of the substrate 4.

In the case where the lead terminals 2 have the protrusions 3, the volume of the lead terminals 2 locally increases at the protrusions 3 so that thermal capacity is improved. It is therefore easy to maintain the protrusions 3 at a high temperature, so that wetting of the solder 6 at the protrusions 3 can be improved. The protrusions 3 can also improve wetting of the solder 6 by utilizing surface tension of the solder 6.

Wetting of the solder 6 utilizing surface tension will be described with use of FIGS. 3 and 4. The solder 6 having reached the lower end portion of each of the protrusions 3 is wet upward at the lower end portion of the protrusion 3 by surface tension. The wet solder 6 is moved along the protrusion 3 by surface tension to form a fillet on the top surface of the substrate 4.

The portion above the lower end portion of the protrusion 3 is wider than each of the through holes 5, and the distance between the substrate 4 and the protrusion 3 on the top surface of the substrate 4 is smaller than the distance between the substrate 4 and the lead terminal 2 on the bottom surface of the substrate 4. A smaller amount of solder 6 is thus required to form the solder fillet on the top surface of the substrate 4 than on the bottom surface of the substrate 4. In a case where the same amount of solder 6 is supplied onto the top surface and the bottom surface of the substrate 4, a large solder fillet can stably be formed as illustrated in FIG. 4.

If the protrusion 3 is partially located at the upper end of the through hole 5 located at the same level as the top surface of the substrate 4 in a state of the lead terminal 2 being inserted into the through hole 5, the semiconductor device 100 is fixed at a location where the solder fillet is formed.

Figure 5A:
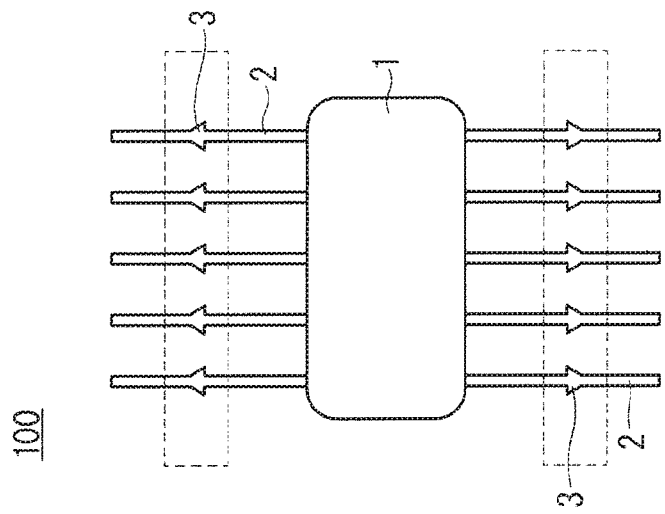
FIGS. 5A to 5C illustrate a method of manufacturing the semiconductor device according to Embodiment 1.
Figure 5B:
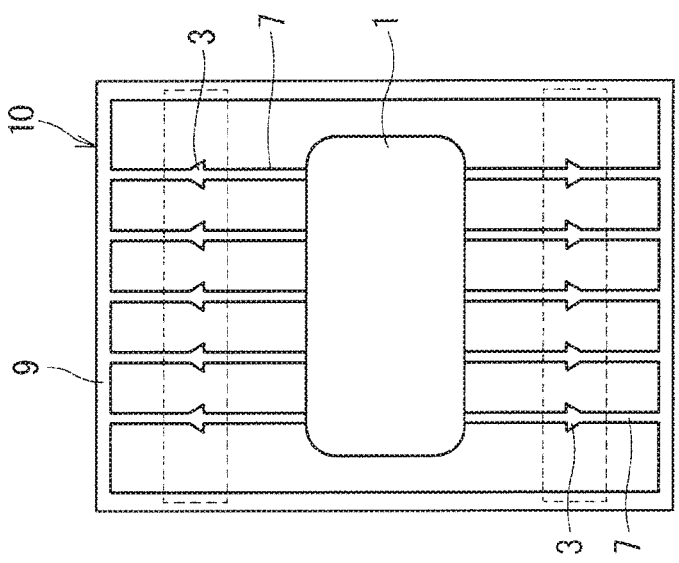
Figure 5C:
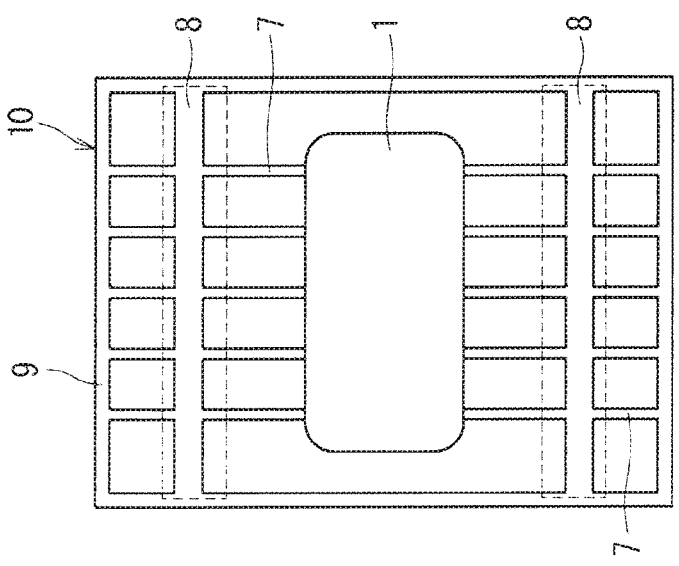

The protrusions 3 can be manufactured using a press mold when the lead terminals 2 are formed. A method of manufacturing the semiconductor device 100 will be described next. FIGS. 5A to 5C illustrate the method of manufacturing the semiconductor device 100 according to Embodiment 1. Specifically, FIG. 5A is a plan view illustrating a state of the energization controller having been sealed with the sealing resin 1. FIG. 5B is a plan view illustrating a state of frames 8 having been processed to form the protrusions 3. FIG. 5C is a plan view illustrating a state of an outer frame 9 having been cut to form the lead terminals 2.

First, a lead frame 10 having a plurality of leads 7, the frames 8 to connect the other end side of each of the leads 7, and the outer frame 9 to enclose the leads 7 and the frames 8 is placed.

Next, as illustrated in FIG. 5A, the energization controller is formed on the one end side of each of the leads 7, and the energization controller is sealed with the sealing resin 1. Next, as illustrated in FIG. 5B, the frames 8 are pressed to form the protrusions 3. In this step, regions enclosed by broken lines in FIGS. 5A and 5B are processed.

Next, as illustrated in FIG. 5C, the outer frame 9 is cut through pressing to form the lead terminals 2 having the protrusions 3. The semiconductor device 100 is manufactured through the above-mentioned steps.

As described above, the semiconductor device 100 according to Embodiment 1 includes the energization controller including the semiconductor element and the wiring, the sealing resin 1 to cover the energization controller, and the lead terminals 2 each having the one end side connected to the energization controller and the other end side protruding from the sealing resin 1, and the lead terminals 2 each have a protrusion 3 formed on a part of the other end side protruding from the sealing resin 1.

Since the lead terminals 2 each have the protrusion 3 formed on the part of the other end side protruding from the sealing resin 1, the solder fillets can stably be formed at mounting on the substrate in the substrate inserted lead-type semiconductor device 100.

The method of manufacturing the semiconductor device 100 includes: (a) placing the lead frame 10 having the leads 7, the frames 8 to connect the other end side of each of the leads 7, and the outer frame 9 to enclose the leads 7 and the frames 8; (b) forming the energization controller on the one end side of each of the leads 7; (c) sealing the energization controller with the sealing resin 1; (d) pressing the frames 8 to form the protrusions 3; and (e) cutting the outer frame 9 through pressing to form the lead terminals 2.

Since the protrusions 3 can be formed using the press mold when the lead terminals 2 are formed, the protrusions 3 enabling stable formation of the solder fillets can be formed while an increase in manufacturing cost of the semiconductor device 100 is suppressed.

Modifications of Embodiment 1

In the above-mentioned description, each of the protrusions 3 is tapered, that is to say, inverted triangular in front view to become narrower with increasing distance from the energization controller. The shape of the protrusion 3, however, is not limited to this shape, and the protrusion 3 may have another shape.

FIG. 6 is an enlarged view of a protrusion 13 and its surroundings of the semiconductor device 100 according to Modification 1 of Embodiment 1 at insertion into the substrate. FIG. 7 is an enlarged view of a protrusion 23 and its surroundings of the semiconductor device 100 according to Modification 2 of Embodiment 1 at insertion into the substrate. FIG. 8 is an enlarged view of a protrusion 33 and its surroundings of the semiconductor device 100 according to Modification 3 of Embodiment 1 at insertion into the substrate.

FIGS. 6 and 7 illustrate examples of the shapes of the protrusions 13 and 23 enabling formation of fillets on the top surface of the substrate 4 using a smaller amount of solder 6 compared with a case of the protrusion 3. As illustrated in FIG. 6, the protrusion 13 may be rectangular in front view. As illustrated in FIG. 7, the protrusion 23 may be elliptical in front view.

In the cases of FIGS. 6 and 7, the volume of the lead terminals 2 locally increases at the protrusions 13 and 23 so that thermal capacity is improved. It is therefore easy to maintain the protrusions 13 and 23 at a high temperature, so that wetting of the solder 6 at the protrusions 13 and 23 can be improved. The protrusions 13 and 23 can also improve wetting of the solder 6 by utilizing surface tension of the solder 6. Furthermore, the protrusions 13 and 23 each have a larger area at the same level as the top surface of the substrate 4 compared with the protrusion 3 illustrated in FIG. 3, and are laterally wet using a smaller amount of solder 6 compared with the protrusion 3, so that the solder fillets can stably be formed using a smaller amount of solder 6 at mounting on the substrate.

FIG. 8 illustrates an example of the shape of the protrusion 33 enabling further improvement in wetting of the solder 6. As illustrated in FIG. 8, it is desirable that a lower end portion of the protrusion 33 be placed inside the through hole 5. It is thus desirable that the protrusion 33 has a taper angle θ with respect to a side surface of the lead terminal 2 of less than 45°. While a tapered portion 3a of the protrusion 3 illustrated in FIG. 3 is straight, a tapered portion 33a of the protrusion 33 illustrated in FIG. 8 is curved inward so that the solder 6 is more likely to be wet compared with the case of the protrusion 3. That is, the protrusion 33 is tapered in a front view to become narrower with increasing distance from the semiconductor element such that a tapered portion 33a of the protrusion 33 is curved inward toward a center of a respective lead terminal 2 of the plurality of lead terminals, the protrusion 33 being symmetrical with respect to a center line of the respective lead terminal 2 of the plurality of lead terminals in the front view, the center line extending from the protrusion 33 to the other end side.

Since the protrusion 33 is tapered in front view to become narrower with increasing distance from the energization controller, and has the taper angle θ with respect to the side surface of the lead terminal of less than 45°, the solder 6 is more likely to be wet compared with the case of the protrusion 3, and it is easier to stably form the solder fillets at mounting on the substrate.

Embodiment 2

The semiconductor device 100 according to Embodiment 2 will be described next. FIG. 9 is an enlarged view of a protrusion 3 and its surroundings of the semiconductor device 100 according to Embodiment 2 at insertion into the substrate. In Embodiment 2, the same components as those described in Embodiment 1 bear the same reference signs as those in Embodiment 1, and description thereof is omitted.

In Embodiment 2, to improve solder wetting and mountability on the substrate 4, a portion of the lead terminal 2 and the protrusion be located inside the through hole 5 of the substrate 4 and a portion around the portion (hereinafter, referred to as a "surface processed region") have a plurality of small cuts 14. More specifically, the surface processed region is the portion of the lead terminal 2 and the protrusion 3 to be located inside the through hole 5 of the substrate 4 and portions above and below the portion.

The cuts 14 formed in the surface processed region of the lead terminal 2 and the protrusion 3 can improve wetting of the solder 6 by utilizing capillary action. The surface processed region may be located only on front surfaces of the lead terminal 2 and the protrusion 3, or may be located on the front surfaces and back surfaces of the lead terminal 2 and the protrusion 3.

Figure 10:
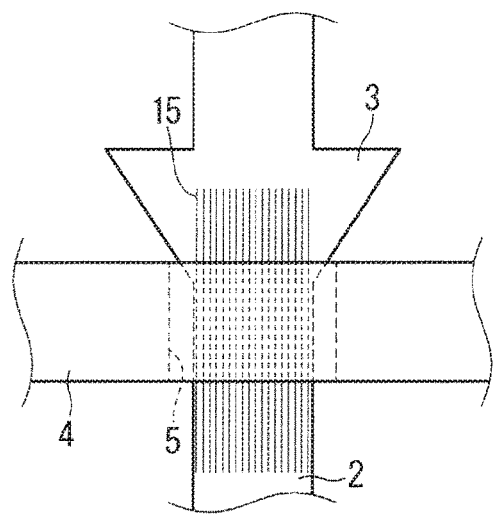
FIG. 10 is an enlarged view of a protrusion and its surroundings of a semiconductor device according to Modification 1 of Embodiment 2 at insertion into the substrate.
Figure 11:
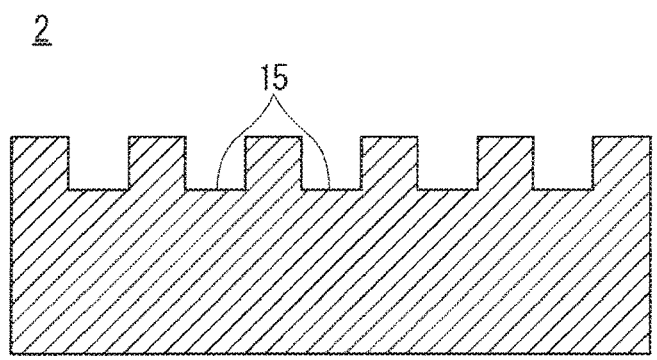
FIG. 11 is a sectional view illustrating one example of a plurality of grooves formed in a surface processed region.

In place of the cuts 14, a plurality of grooves 15 or a plurality of asperities 16 may be formed in the surface processed region. FIG. 10 is an enlarged view of a protrusion 3 and its surroundings of the semiconductor device 100 according to Modification 1 of Embodiment 2 at insertion into the substrate. FIG. 11 is a sectional view illustrating one example of the grooves 15 formed in the surface processed region. FIGS. 12 to 15 are sectional views illustrating other examples of the grooves 15 formed in the surface processed region.

Figure 12:
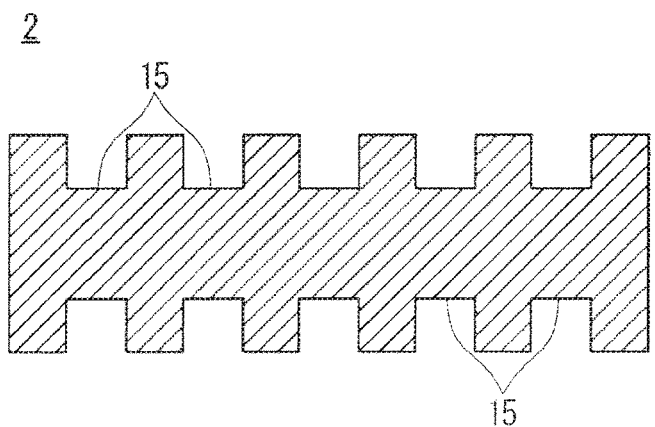
FIG. 12 is a sectional view illustrating another example of the grooves formed in the surface processed region.

As illustrated in FIG. 10, a plurality of fine grooves 15 extending along the length of the lead terminal 2 are formed in the surface processed region. The grooves 15 may be rectangular grooves formed only in the front surfaces of the lead terminal 2 and the protrusion 3 as illustrated in FIG. 11, or may be rectangular grooves formed in the front surfaces and the back surfaces of the lead terminal 2 and the protrusion 3 as illustrated in FIG. 12. The grooves 15 formed in the front surfaces and the back surfaces of the lead terminal 2 and the protrusion 3 can further improve wetting of the solder 6.

Figure 13:
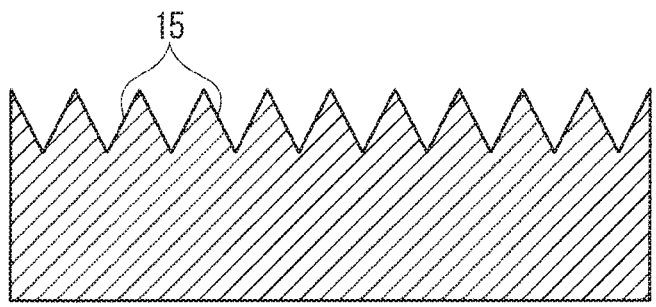
FIG. 13 is a sectional view illustrating yet another example of the grooves formed in the surface processed region.
Figure 14:
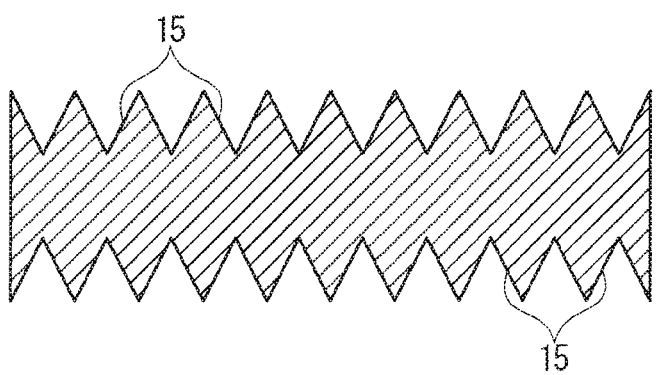
FIG. 14 is a sectional view illustrating yet another example of the grooves formed in the surface processed region.

Alternatively, the grooves 15 may be serrated grooves formed only in the front surfaces of the lead terminal 2 and the protrusion 3 as illustrated in FIG. 13, or may be serrated grooves foliated in the front surfaces and the back surfaces of the lead terminal 2 and the protrusion 3 as illustrated in FIG. 14. The serrated grooves 15, that is to say, the grooves 15 formed so that the lead terminal 2 is tapered to become narrower with increasing distance from the center thereof can reduce entrainment of air when the solder 6 is wet, and thus are expected to further improve solder wetting.

Figure 15:
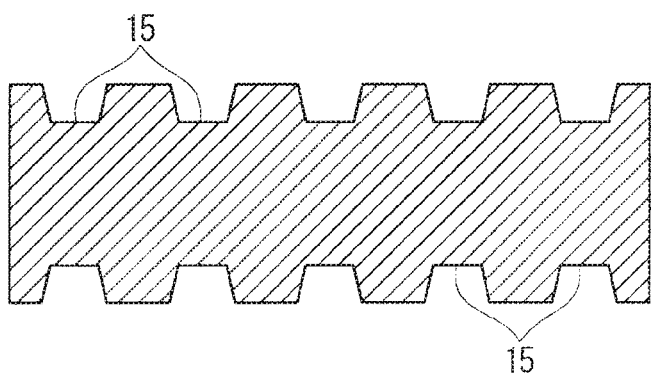
FIG. 15 is a sectional view illustrating yet another example of the grooves formed in the surface processed region.

Alternatively, the grooves 15 may be trapezoidal grooves formed in the front surfaces and the back surfaces of the lead terminal 2 and the protrusion 3 as illustrated in FIG. 15. In a case where the lead terminal 2 might be deformed by forming the grooves 15 in the front surfaces and the back surfaces of the lead terminal 2 and the protrusion 3 so that the lead terminal 2 is tapered as illustrated in FIG. 14, the grooves 15 are caused to be gently inclined as illustrated in FIG. 15 to provide a required strength to the lead terminal 2.

Figure 16:
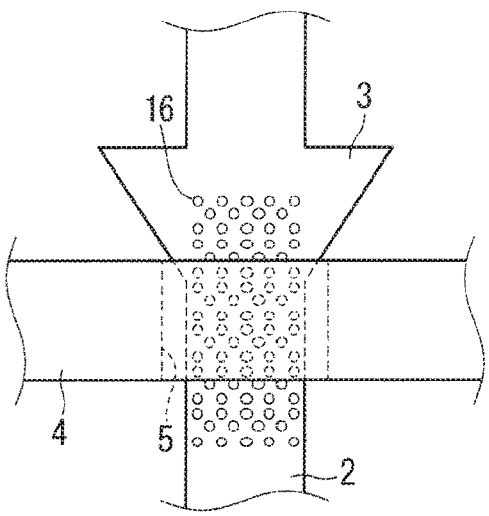
FIG. 16 is an enlarged view of a protrusion and its surroundings of a semiconductor device according to Modification 2 of Embodiment 2 at insertion into the substrate.
Figure 17:
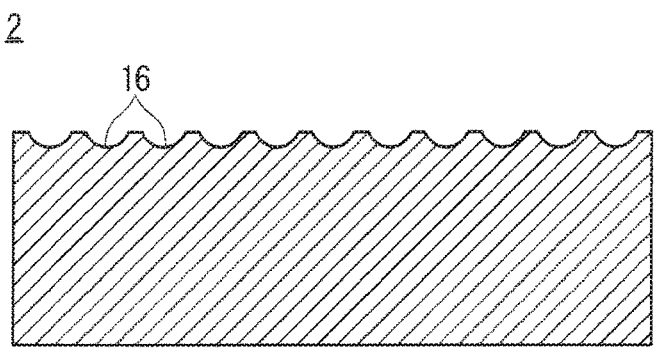
FIG. 17 is a sectional view illustrating one example of a plurality of asperities formed in the surface processed region.
Figure 18:
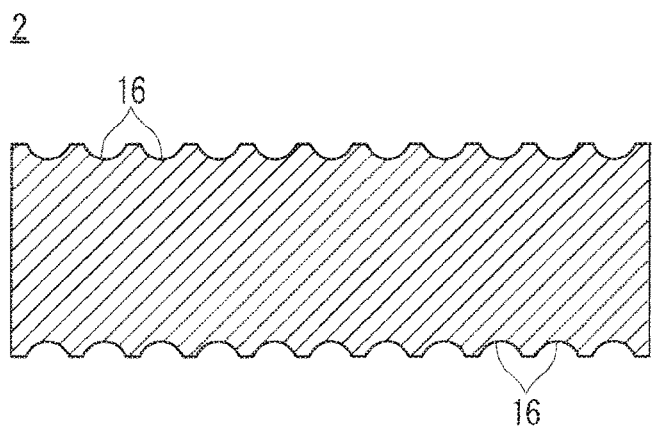
FIG. 18 is a sectional view illustrating another example of the asperities formed in the surface processed region.

FIG. 16 is an enlarged view of a protrusion 3 and its surroundings of the semiconductor device 100 according Modification 2 of Embodiment 2 at insertion into the substrate. FIG. 17 is a sectional view illustrating one example of the asperities 16 formed in the surface processed region. FIG. 18 is a sectional view illustrating another example of the asperities 16 formed in the surface processed region.

As illustrated in FIG. 16, the asperities 16 are formed in the surface processed region. The asperities 16 may be asperities formed only on the front surfaces of the lead terminal 2 and the protrusion 3 as illustrated in FIG. 17, or may be asperities formed on the front surfaces and the back surfaces of the lead terminal 2 and the protrusion 3 as illustrated in FIG. 18.

Figure 19A:
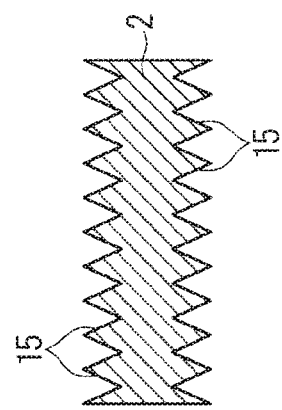
FIGS. 19A to 19C illustrate a method of forming the grooves.
Figure 19B:
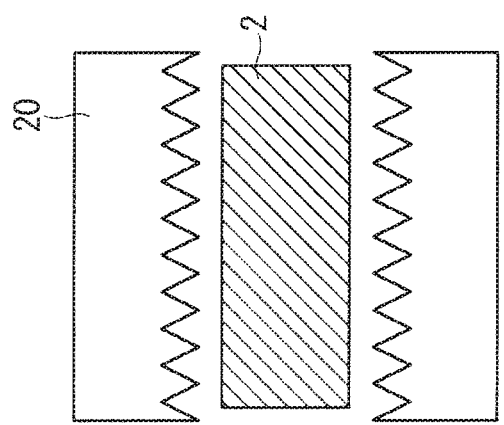
Figure 19C:
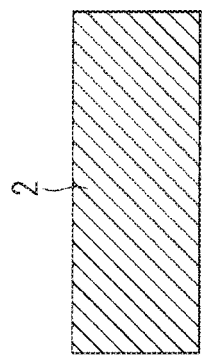

A method of forming the grooves 15 in the surface processed region of the lead terminal 2 and the protrusion 3 will be described next. FIGS. 19A to 19C illustrate the method of forming the grooves 15. Specifically, FIG. 19A is a schematic view of the lead terminal 2 before formation of the grooves 15, and FIG. 19B is a schematic view illustrating a state of the lead terminal 2 being set in a press mold 20. FIG. 19C is a schematic view of the lead terminal 2 after formation of the grooves 15.

As illustrated in FIGS. 19A to 19C, the lead terminal 2 set in the press mold 20 is pressed by the press mold 20 to have the grooves 15 in the surface processed region of the lead terminal 2 and the protrusion 3.

A method of forming the asperities 16 in the surface processed region of the lead terminal 2 and the protrusion 3 will be described next. FIGS. 20A to 20C illustrate the method of forming the asperities 16. Specifically, FIG. 20A is a schematic view of the lead terminal 2 before formation of the asperities 16, and FIG. 20B is a schematic view illustrating a state of the lead terminal 2 being bead blasted. FIG. 20C is a schematic view of the lead terminal 2 after formation of the asperities 16.

As illustrated in FIGS. 20A to 20C, wet or dry bead blasting is performed to hit beads 21 as fine grained substances against the surface processed region of the lead terminal 2 and the protrusion 3 to form the asperities 16 in the surface processed region of the lead terminal 2 and the protrusion 3. There is concern about exposure of a metal surface of the lead terminal 2 and the like in a case where bead blasting is performed after plating, so that it is preferable to perform bead blasting before plating. The depth and roughness of the asperities 16 can be adjusted by adjusting grain sizes of the beads 21 and blasting time. Instead of performing bead blasting to hit the beads 21, sand blasting to hit sand as the fine grained substances may be performed.

As described above, in the semiconductor device 100 according to Embodiment 2, the portion of the lead terminal 2 and the protrusion 3 to be located inside the through hole 5 of the substrate 4 and the portion around the portion have the cuts 14, the grooves 15 extending along the length of the lead terminal 2, or the asperities 16. Wetting of the solder 6 can thus be improved by utilizing capillary action.

Forming the grooves 15 through pressing or the asperities 16 through bead blasting or sand blasting with respect to the portion of the lead terminal 2 and the protrusion 3 to be located inside the through hole 5 of the substrate 4 and the portion around the portion is further included, so that a structure to improve wetting of the solder 6 can easily be formed.

In the above-mentioned description, the portion of the lead terminal 2 and the protrusion 3 to be located inside the through hole 5 of the substrate 4 and the portion around the portion have the cuts 14, the grooves 15, or the asperities 16. A target of formation of the cuts 14, the grooves 15, or the asperities 16, however, is not limited to the protrusion 3, and may be the protrusions 13, 23, and 33 in place of the protrusion 3. Similar effects can be obtained in this case.

Embodiments of the present invention can freely be combined with each other, and can be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A substrate inserted lead type semiconductor device to be mounted through insertion of a plurality of lead terminals into a plurality of respective through holes of a substrate, the semiconductor device comprising:
    an energization controller including a semiconductor element and wiring;
    a sealing resin to cover the energization controller; and
    each of the plurality of lead terminals having one end side connected to the energization controller and an other end side protruding from the sealing resin, wherein
    each of the plurality of lead terminals has a protrusion formed on a part of the other end side protruding from the sealing resin,
    each of the plurality of lead terminals has a first narrow portion narrower than the protrusion positioned between the protrusion and the sealing resin and a second narrow portion narrower than the protrusion positioned on a side of the protrusion opposite to the sealing resin,
    each of the first narrow portions is bent, and
    a plurality of grooves are positioned on both of a front side and a back side of each of the plurality of lead terminals, the plurality of grooves extending from the second narrow portion toward the first narrow portion, and a portion of each of the plurality of lead terminals interposing between the plurality of grooves positioned on the front side and the plurality of grooves positioned on the back side.

2. The semiconductor device according to claim 1, wherein
    a portion of each of the plurality of lead terminals and the protrusion to be located inside a through hole of the substrate and a portion around the portion have the plurality of grooves.

3. The semiconductor device according to claim 1, wherein
    the protrusion is tapered in a front view to become narrower with increasing distance from the energization controller, and
    the protrusion has a taper angle with respect to a side surface of a respective lead terminal of the plurality of lead terminals of less than 45°.

4. The semiconductor device according to claim 3, wherein
    a tapered portion of the protrusion is curved inward toward a center of the respective lead terminal of the plurality of lead terminals.

5. A method of manufacturing the semiconductor device according to claim 1, the method comprising:
    (a) placing a lead frame having a plurality of leads, a frame to connect an end side of each of the plurality of leads, and an outer frame to enclose the plurality of leads and the frame;
    (b) forming the energization controller on an other end side of each of the plurality of leads;
    (c) sealing the energization controller with the sealing resin;
    (d) pressing the frame to form the protrusion formed on each of the plurality of lead terminals; and
    (e) cutting the outer frame through pressing to form the plurality of lead terminals.

6. The method of manufacturing the semiconductor device according to claim 5, the method further comprising:

(f) forming the plurality of grooves through pressing with respect to a portion of each of the plurality of lead terminals and the protrusion to be located inside one of the plurality of respective through holes of the substrate and a portion around the portion.

7. The semiconductor device according to claim 1, wherein
each of the plurality of grooves has a rectangular shape in a cross-sectional view of each of the plurality of lead terminals.

8. The semiconductor device according to claim 1, wherein
the plurality of grooves are serrated grooves.

9. The semiconductor device according to claim 8, wherein
each of the plurality of grooves has a triangular shape in a cross-sectional view of each of the plurality of lead terminals.

10. The semiconductor device according to claim 1, wherein
side surfaces of each of the plurality of grooves are inclined away from a center of each of the plurality of grooves.

11. The semiconductor device according to claim 10, wherein
each of the plurality of grooves has a trapezoidal shape in a cross-sectional view of each of the plurality of lead terminals.

* * * * *